(12) United States Patent
Perner et al.

(10) Patent No.: US 6,775,196 B2
(45) Date of Patent: Aug. 10, 2004

(54) MAGNETIC MEMORY HAVING A TEMPERATURE COMPENSATED WRITE CIRCUIT

(75) Inventors: Frederick A. Perner, Palo Alto, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 11 days.

(21) Appl. No.: 10/194,767

(22) Filed: Jul. 12, 2002

(65) Prior Publication Data

US 2004/0008557 A1 Jan. 15, 2004

(51) Int. Cl.[7] ................................................. G11C 7/04
(52) U.S. Cl. ...................................... 365/211; 365/212
(58) Field of Search ................................. 365/211, 212, 365/213, 242, 171, 158, 173, 189.09

(56) References Cited

U.S. PATENT DOCUMENTS

| | | | |
|---|---|---|---|
| 6,069,821 A | * | 5/2000 | Jun et al. ............... 365/185.21 |
| 6,111,783 A | | 8/2000 | Tran et al. |
| 6,215,707 B1 | | 4/2001 | Moyer |
| 6,256,224 B1 | | 7/2001 | Perner et al. |
| 6,335,890 B1 | | 1/2002 | Reoher et al. |
| 6,385,082 B1 | * | 5/2002 | Abraham et al. ........... 365/171 |
| 6,608,790 B2 | * | 8/2003 | Tran et al. .................. 365/211 |
| 6,657,889 B1 | * | 12/2003 | Subramanian et al. ...... 365/158 |

* cited by examiner

*Primary Examiner*—Anh Phung (57) ABSTRACT

A magnetic memory is disclosed. In one embodiment, the magnetic memory includes a magnetic memory cell, a conductor which crosses the magnetic memory cell and a circuit coupled to the conductor configured to apply a modified magnetic field to the magnetic memory cell in response to temperature variations in the magnetic memory cell.

17 Claims, 7 Drawing Sheets

MAGNETIC MEMORY HAVING A TEMPERATURE COMPENSATED WRITE CIRCUIT

THE FIELD OF THE INVENTION

The present invention generally relates to the field of magnetic memories. More particularly, the present invention relates to a magnetic memory device and method wherein a magnetic field is modified to compensate for temperature variations in a magnetic memory cell.

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations, parallel and anti-parallel, represent, for example, logic values of "0" and "1."

Typically, the orientation of magnetization in the data storage layer aligns along an axis of the data storage layer that is commonly referred to as its easy axis. The external magnetic fields are applied to flip the orientation of magnetization in the data storage layer along its easy axis to either a parallel or anti-parallel orientation. With parallel orientation, the magnetic memory cell is in a low resistance state because the orientation of magnetization in its data storage layer is substantially parallel along the easy axis. With anti-parallel orientation, the magnetic memory cell is in a high resistance state because the orientation of magnetization in its data storage layer is substantially anti-parallel along the easy axis.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A selected magnetic memory cell is usually written by applying electrical currents to the particular word and bit lines that intersect at the selected magnetic memory cell. The electrical current applied to the particular bit line generates a magnetic field substantially aligned along the easy axis of the selected magnetic memory cell. This magnetic field may be referred to as a bit line write field. An electrical current applied to the particular word line also generates a magnetic field substantially perpendicular to the easy axis of the selected magnetic memory cell. This magnetic field may be referred to as a word line write field. The sum of the bit line write field and the word line write field must be greater than a critical switching field or write threshold to enable the magnetization in the data storage layer to change and align according to the applied write fields. A magnetic memory cell receiving only the word line or the bit line write field is termed a half-selected magnetic memory cell. The magnitudes of the word line and bit line write fields are usually chosen to be high enough so that the magnetization in the data storage layer of the selected magnetic memory cell changes and aligns according to the applied write fields, but not too high so that the half-selected magnetic memory cells which are subject to either the word line or the bit line write field do not change their direction of magnetization in the data storage layer.

One problem that can occur in the magnetic memory is temperature variations within the array of magnetic memory cells. Operation of the array or changes in the ambient temperature can cause the temperature of the magnetic memory cells to vary, which in turn causes the coercivity of the magnetic memory cells to change. The coercivity of the magnetic memory cells decreases with increasing temperature resulting in a decrease in the critical switching field. Increasing temperatures can increase the likelihood that either the bit line write field or the word line write field will be high enough to cause half-select switching of magnetic memory cells. Conversely, decreasing temperatures increase the likelihood that the sum of the bit line write field and the word line write field will not be higher than the critical switching field required to switch the magnetic memory cells.

SUMMARY OF THE INVENTION

The present invention provides a magnetic memory. In one embodiment, the magnetic memory includes a magnetic memory cell, a conductor which crosses the magnetic memory cell and a circuit coupled to the conductor configured to apply a modified magnetic field to the magnetic memory cell in response to temperature variations in the magnetic memory cell.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
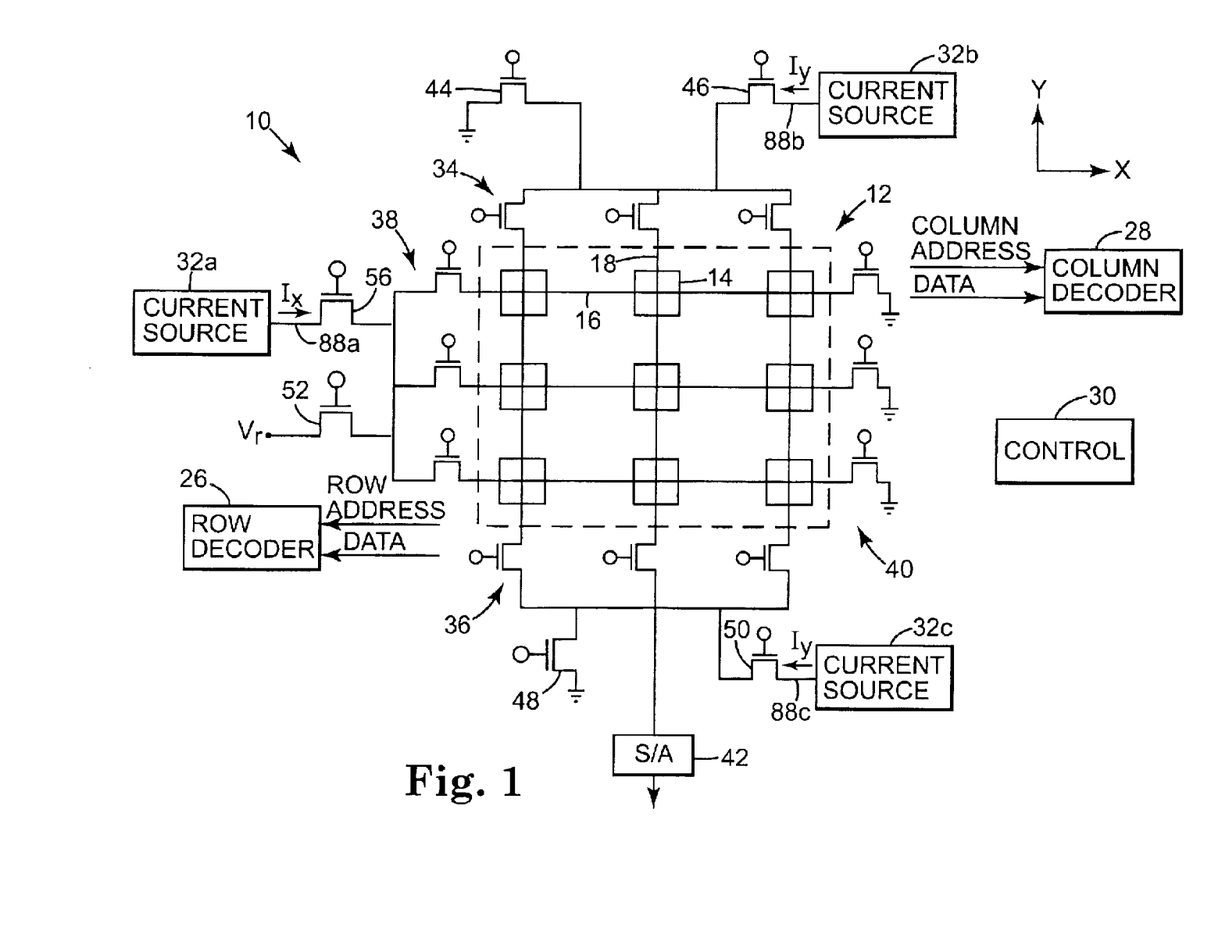
FIG. 1 is a diagram illustrating one exemplary embodiment of a magnetic memory according to the present invention.

FIG. 1 is a diagram illustrating one exemplary embodiment of a magnetic memory according to the present invention. In magnetic memory 10, a write circuit is coupled to a conductor which crosses a magnetic memory cell. The write circuit is configured to apply a modified magnetic field to the magnetic memory cell, wherein the magnetic field is modified to compensate for temperature variations in the magnetic memory cell.

The magnetic memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size.

In one embodiment, word lines 16 extend along the x-direction in a plane on one side of array 12 and bit lines 18 extend along the y-direction in a plane on an opposite side of array 12. In one embodiment, there is one word line 16 for each row of array 12 and one bit line 18 for each column of array 12. In the embodiment illustrated in FIG. 1, magnetic memory cell 14 is located at an intersection or cross point of a word line 16 and a bit line 18.

The magnetic memory cells 14 are not limited to any particular type of device. In one embodiment, magnetic memory cells 14 are spin dependent tunneling ("SDT") junction devices. In alternative embodiments, other types of magnetic memory cells are formed which include, but are not limited to, anisotropic magnetoresistance devices, giant magnetoresistance devices, colossal magnetoresistance devices, extraordinary magnetoresistance devices or very large magnetoresistance devices.

In one embodiment, MRAM device 10 includes a row decoder 26, a column decoder 28 and a control 30. Control 30 is coupled to the row decoder 26 to control row decoder 26 during read and write operations. Row decoder 26 is coupled to the gates of switching transistors 38 and switching transistors 40, and opens and closes switching transistors 38 and switching transistors 40 in accordance with instructions received from control 30. Control 30 is also coupled to column decoder 28 to control column decoder 28 during read and write operations. Column decoder 28 is coupled to the gates of switching transistors 34 and switching transistors 36, and opens and closes switching transistors 34 and switching transistors 36 in accordance with instructions received from control 30.

During a write operation, to supply a word line write current, switching transistors 38 and switching transistor 56 selectively couple word lines 16 to output 88a of current source 32a which provides a row write current $I_x$. Switching transistors 40 selectively couple word lines 16 to ground. To supply a bit line write current in a first direction, switching transistors 34 and switching transistor 46 selectively couple a first end of bit lines 18 to output 88b of current source 32b which provides a column write current $I_y$ in the first direction. Switching transistors 36 and switching transistor 48 selectively a second end of bit lines 18 to ground. To supply a bit line write current in a second direction, switching transistors 36 and switching transistor 50 selectively couple a first end of bit lines 18 to output 88c of current source 32c which provides a column write current $I_y$ in the second direction. Switching transistors 34 and switching transistor 44 selectively couple a second end of bit lines 18 to ground.

During a read operation, switching transistors 38 and switching transistor 52 selectively couple one end of word lines 16 to a read voltage source $V_r$. Switching transistors 40 selectively couple the other end of word lines 16 to ground. Switching transistors 34 are opened to isolate one end of the bit line from each other and switching transistors 36 selectively couple the other end of the bit lines 18 to sense amplifier 42.

In one embodiment, magnetic memory cell 14 can store two logic states, "0" or "1", which correspond to either to a parallel or an anti-parallel logic state. The magnetic fields $H_y$ and $H_x$ generated by the write currents $I_x$ and $I_y$ respectively combine to change the binary state of magnetic memory cell 14 from either a logical "1" to a logical "0" or from a logical "0" to a logical "1".

In a first embodiment to illustrate writing magnetic memory cell 14, the row write current $I_x$ is supplied from current source 32a via switching transistor 56 and selected switching transistors 38 to a selected word line 16, through a selected switch transistor 40 to ground. To write a logical "0", the column write current $I_y$ is supplied from current source 32b via switching transistor 46 and selected switching transistors 34 to selected bit lines 18, through selected switching transistors 36 and switch transistor 48 to ground. To write a logical "1", the column write current $I_y$ is supplied from current source 32c via switching transistor 50 and selected switching transistors 36 to selected bit lines 18, through selected switching transistors 34 and switch transistor 44 to ground.

In a second embodiment to illustrate writing magnetic memory cell 14, the row write current $I_x$ is supplied from current source 32a via switching transistor 56 and selected switching transistors 38 to a selected word line 16, through a selected switch transistor 40 to ground. To write a logical "1", the column write current $I_y$ is supplied from current source 32b via switching transistor 46 and selected switching transistors 34 to selected bit lines 18, through selected switching transistors 36 and switch transistor 48 to ground. To write a logical "0", the column write current $I_y$ is supplied from current source 32c via switching transistor 50 and selected switching transistors 36 to selected bit lines 18, through selected switching transistors 34 and switch transistor 44 to ground.

Figure 2A:
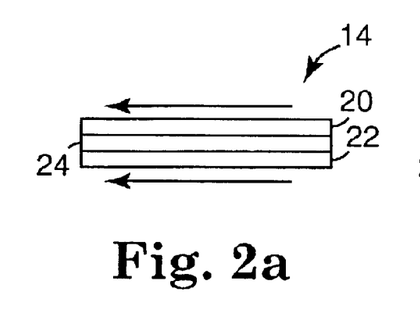
FIGS. 2a and 2b are diagrams illustrating parallel and anti-parallel magnetization of a magnetic memory cell.
Figure 2B:
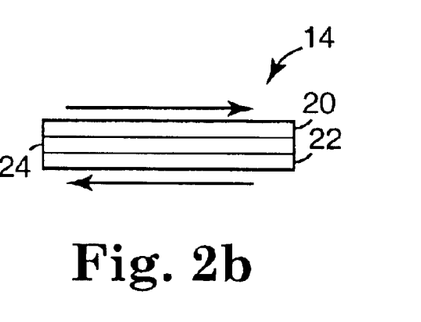

FIGS. 2a and 2b are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 2a illustrates by arrows a "parallel" orientation when the magnetization of the free and pinned layers 20 and 22 are in the same direction. FIG. 2b illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 2a. The resistance of magnetic memory cell 14 is increased to a second value R+ΔR when the orientation of magnetization is changed from parallel to anti-parallel as illustrated in FIG. 2b.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

Figure 3:
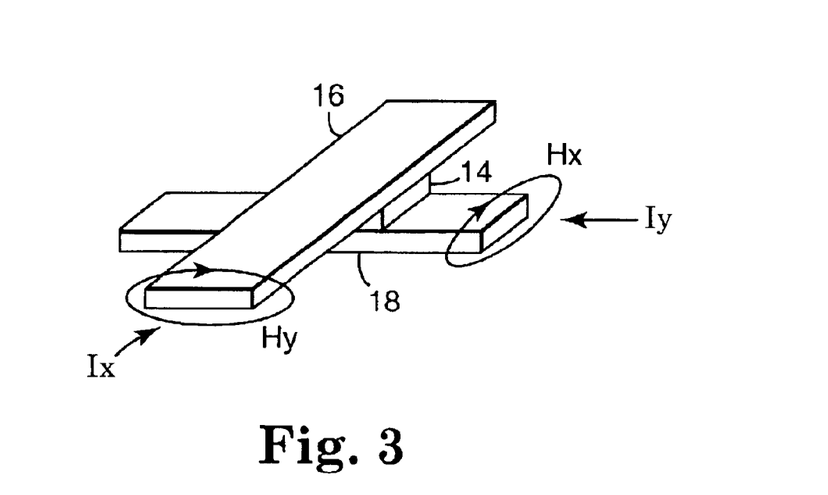
FIG. 3 is a diagram illustrating a magnetic memory cell that has been selected during a write operation.

FIG. 3 is a diagram illustrating a magnetic memory cell that has been selected during a write operation. In one embodiment, the magnetization in free layer 20 of selected magnetic memory cell 14 is oriented by supplying the currents $I_x$ and $I_y$ to conductors 16 and 18 which cross selected magnetic memory cell 14. Supplying the current $I_x$ to word line 16 causes a magnetic field $H_y$ to form around conductor 16. Supplying the current $I_y$ to bit line 18 causes a magnetic field $H_x$ to form around bit line 18. When sufficiently large currents $I_x$ and $I_y$ are passed through word line 16 and bit line 18, the magnetic fields $H_x$ and $H_y$ in the vicinity of free layer 20 causes the magnetization of free layer 20 to rotate from the parallel orientation to the anti-parallel orientation, or to rotate the anti-parallel orientation to the parallel orientation. The currents $I_x$ and $I_y$ are selected so that the combined magnetic fields $H_x$ and $H_y$ are sufficient to rotate the orientation of free layer 20, but not too high so as to cause either pinned layer 22 or free layer 20 of half-selected magnetic memory cells to rotate their orientation.

Figure 4:
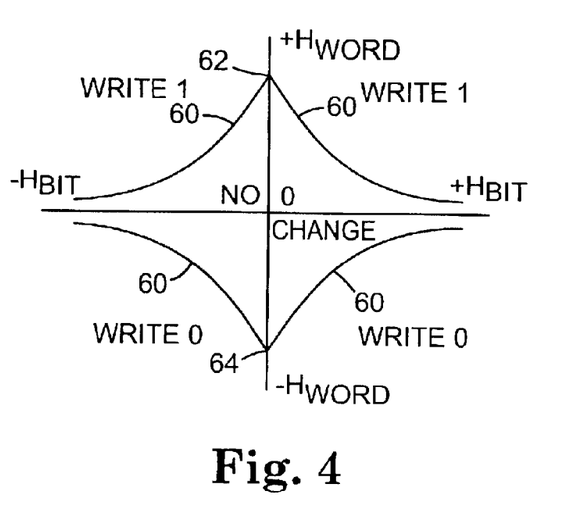
FIG. 4 is a graphical representation of an exemplary relationship of applied current versus writing effectiveness for a typical magnetic memory cell.

FIG. 4 is a graphical representation of an exemplary relationship of applied current versus writing effectiveness for a typical magnetic memory cell. FIG. 4 illustrates the relationship between the applied magnetic fields and the magnetic orientation of the magnetized free layer 20 of magnetic memory cell 14. In one embodiment, magnetic fields are applied to switch the magnetic orientation of the magnetized free layer 20 of magnetic memory cell 14. FIG. 4 illustrates a "no change" region" wherein the magnetic field resulting from the vector sum of the magnetic fields induced by the row and column currents ($I_x$ and $I_y$) are not sufficient to change the direction of the magnetization of free layer 20. The regions outside of the "no change" region are the regions wherein the effective magnetic fields will write either a logical "1" or a logical "0" into the selected magnetic memory cell 14. The boundary between the "no change" region and the writing regions is illustrated in FIG. 4 by four lines at 60. In one embodiment, the half-select threshold is illustrated in FIG. 4 as the point where lines 60 intersect the $+H_{WORD}$ and the $-H_{WORD}$ axes. In one embodiment, magnetic memory cell 14 is half-selected when the bit line current $I_x$ is zero and therefore $H_{BIT}$ is zero, and current $I_y$ for the word line is sufficient to generate a magnetic field $H_{WORD}$ which has a magnitude greater than the intersection at point 62 in the positive direction or greater than point 64 in the negative direction. For ease of illustration, FIG. 4 illustrates a symmetrical writing relationship between writing a logical "1" and writing a logical "0" into the selected magnetic memory cell 14 so that boundary lines 60 are symmetrically located with respect to the axes. Such symmetry is not likely to exist in physical reality, so the axes illustrated in FIG. 4 would likely be shifted from the centered position illustrated in FIG. 4.

In one embodiment, during operation of MRAM device 10, the write currents $I_x$ and $I_y$ along with other support circuitry generate heat within array 12. This, along with a changing ambient temperature, can cause the temperature of magnetic memory cells 14 within array 12 to vary. As the temperature varies, the coercivity and the critical switching field of magnetic memory cells 14 also vary. In MRAM device 10, one or more current sources 32 generate variable write currents $I_x$ and/or $I_y$ that vary to compensate for the coercivity changes in the magnetic memory cells 14 that result from the temperature variations.

Figure 5:
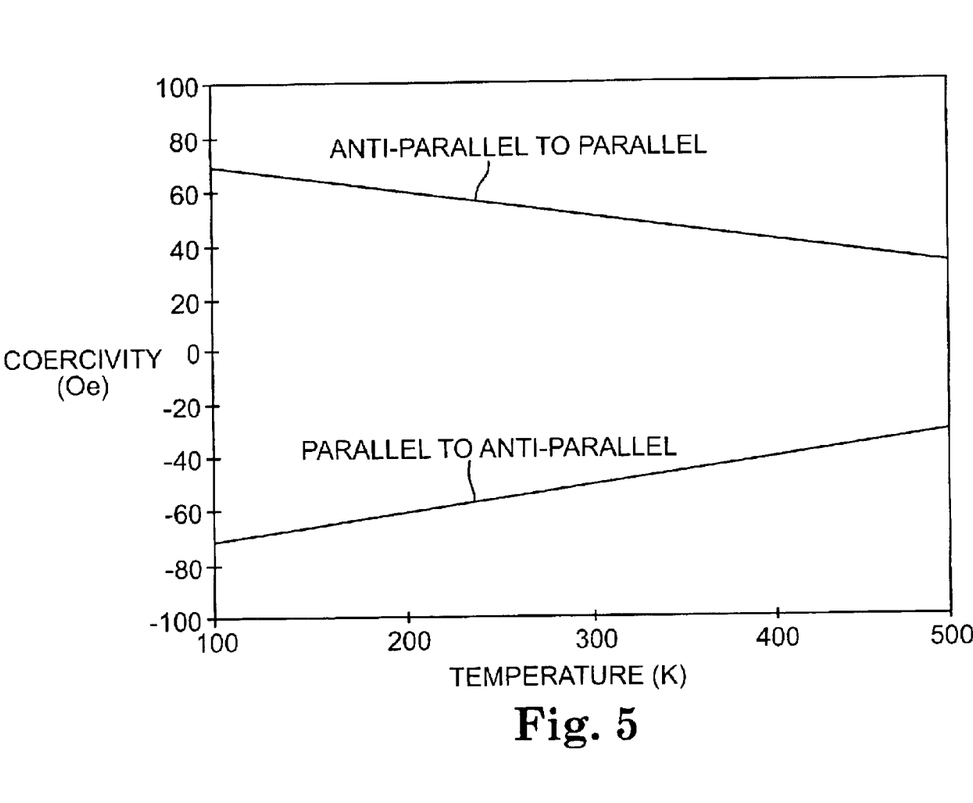
FIG. 5 is a plot of coercivity or critical switching magnetic field versus temperature for a magnetic memory cell.

FIG. 5 is a plot of coercivity or critical switching magnetic field versus temperature for a magnetic memory cell. The critical switching field required to switch magnetic memory cell 14 from either an anti-parallel to a parallel orientation or from a parallel to an anti-parallel orientation decreases with increasing temperature. In one embodiment, during a write operation, the temperature of the magnetic memory cells 14 varies across array 12, and the critical switching field of magnetic memory cells 14 varies across array 12 in accordance with the illustration in FIG. 5. For ease of illustration, FIG. 5 illustrates a symmetrical writing relationship between switching magnetic memory cell 14 from either an anti-parallel to a parallel orientation or from a parallel to an anti-parallel orientation. Such symmetry is not likely to exist in physical reality, so the writing relationship would likely be shifted from the position illustrated in FIG. 5.

Figure 6:
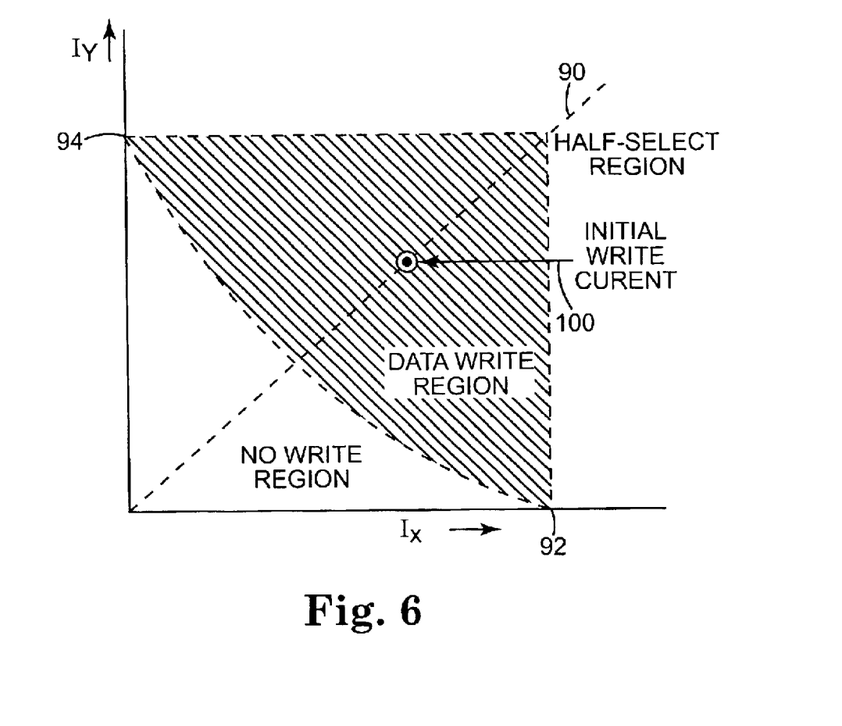
FIG. 6 is a graphical representation of optimized write current for a magnetic memory cell.

FIG. 6 is a graphical representation of optimized write current for a magnetic memory cell. FIG. 6 illustrates that as the word line 16 current $I_x$ and the bit line 18 current $I_y$ are increased along line 90, the selected magnetic memory cell 14 passes through a no write region to a data write region. If the word line 16 current $I_x$ is above the value indicated at 92, or if the bit line 18 current $I_y$ is above the value indicated at 94, half-selected magnetic memory cells 14 which are intersected by only word line 16 or by only bit line 18 will be written. In one embodiment, the optimal reference write current value is indicated at point 100 along line 90, and the optimal reference write current values for $I_x$ and $I_y$ are the points along the $I_x$ and $I_y$ axes which correspond to point 100. The optimal reference write current value at point 100 ensures adequate half-select margins exist.

Figure 7:
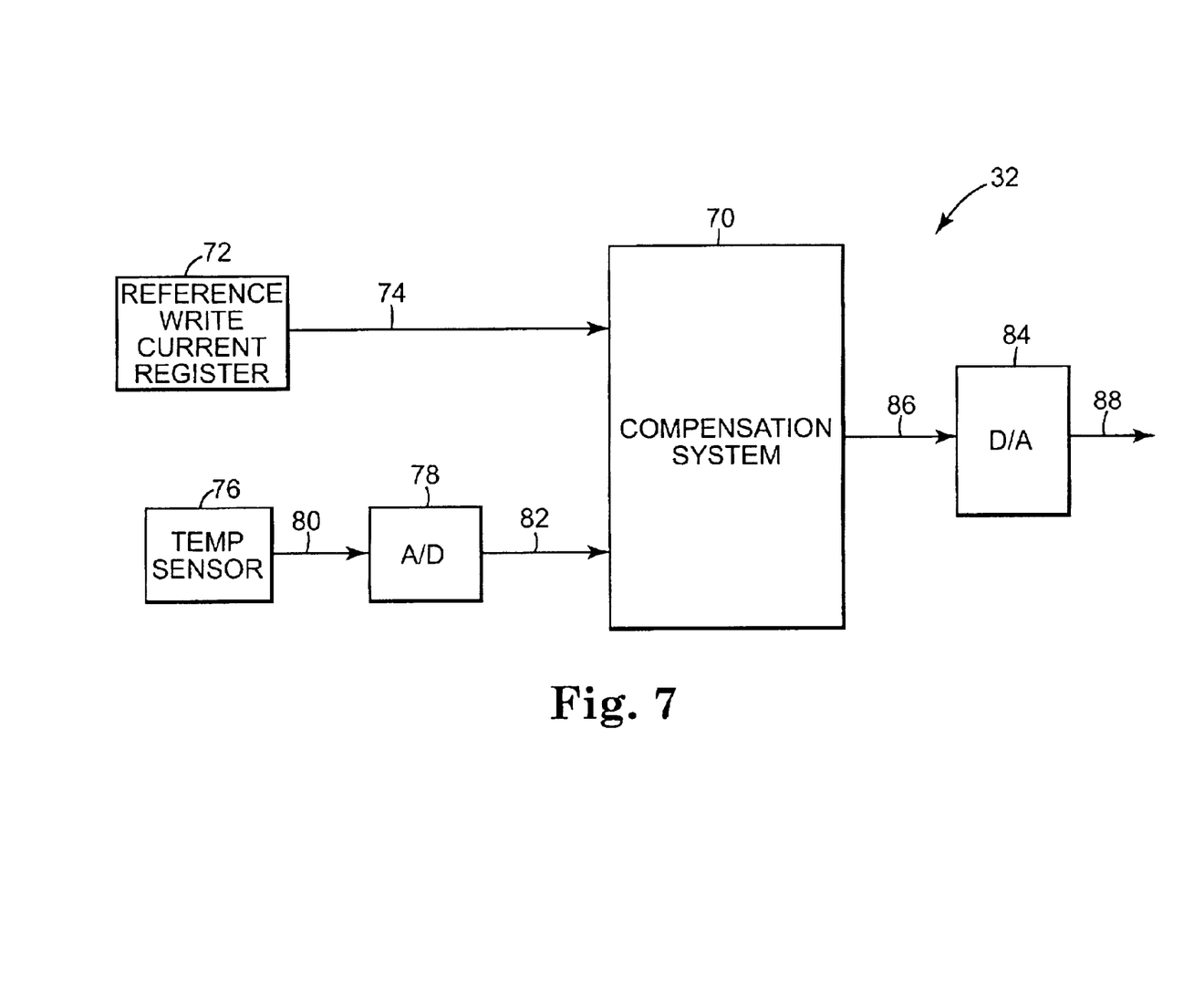
FIG. 7 is a diagram illustrating one exemplary embodiment of a current source according to the present invention.

FIG. 7 is a diagram illustrating one exemplary embodiment of a current source 32 according to the present invention. In one embodiment, current source 32 includes compensation system 70. Compensation system 70 provides a variable digital output to digital to analog converter (DAC) 84 via line 86. The digital output from compensation system 70 is a digital value representing a modified write current value that is varied in order to compensate for coercivity changes in magnetic memory cell 14 that occur as a result of temperature variations across array 12. DAC 84 converts the digital modified write current value into an analog current which is provided as a modified write current output on line 88. Referring to FIG. 1, the modified write current output on line 88 is a variable current which in various embodiments provides one or more of the word line write current $I_x$ at 88a or the bit line write currents $I_y$ at 88b and/or 88c.

In one embodiment, temperature sensing system includes temperature sensor 76 and an analog to digital converter (ADC) 78. Temperature sensor 76 provides an output voltage on line 80 in response to a temperature measured on MRAM device 10. ADC 78 converts the output voltage to a digital value corresponding to the measured temperature and provides a digital measured temperature value corresponding to the measured temperature to compensation system 70 via line 82. In one embodiment, temperature sensor 76 is controlled via control 30. In one embodiment, ADC 78 is controlled via control 30. In one embodiment, temperature sensor 76 is positioned in MRAM device 10 at a suitable location where the temperature of magnetic memory cells 14 can be measured. In one embodiment, temperature sensor 76 is located within array 12. In one embodiment, MRAM device 10 is packaged in a suitable integrated circuit package which includes, but is not limited to, a dual inline package, a quad flat pack package, a pin grid array package, or a ball grid array package, wherein temperature sensor 76 is mounted in the same package as MRAM device 10 and is electrically coupled to MRAM device 10. In one embodiment, MRAM device 10 is mounted on a substrate such as a printed circuit board and temperature sensor 76 is mounted on the same substrate or printed circuit board in close proximity to MRAM device 10 and is electrically coupled to MRAM device 10. In various embodiments, each current source 32 includes a separate temperature sensor 76. In various embodiments, one or more current sources 32 share one or more temperature sensors 76.

In one embodiment, reference write current register 72 provides a digital output on line 74 which is a digital value representing a reference write current value. In one embodiment, reference write current register 72 provides a digital output which corresponds to a write current value which is optimized at a particular temperature to ensure adequate half-select margins exist.

In various embodiments, an optimized reference write current value is determined by varying the digital value provided by reference write current register 72 via control 30 to determine the optimal write current. In one embodiment, the digital value provided by reference write current register 72 is controlled by control 30 to be progressively increased in a step-wise manner of iteration in a constant temperature environment so that the demarcation between the "no write", "write" and "half-select" regions illustrated in FIG. 6 can be determined. At each step, MRAM device 10 performs a write and read operation to determine if the selected memory cells 14 were written and if any half-selected magnetic memory cells 14 were written. The write current is optimized to be the mid point at 100 between the no write region and the half-select region as illustrated in FIG. 6. If the progressive increases in the digital value provided by reference write current register 72 are performed at short intervals, the successive temperature values measure by temperature sensor 76 will be substantially equal so the current provided by compensation system 70 at line 88 will substantially correspond to the digital value provided by reference write current register 72. In various embodiments, reference write current register 72 is controlled via control 30 by means within MRAM device 10 or by means external to MRAM device 10.

In various embodiments, reference write current register 72 provides a digital output which is a digital value representing a previous modified write current value provided by compensation system 70. In various embodiments, the modified write current value is provided by compensation system 70 via control 30 to reference write current register 72 so that a previous modified write current value becomes the reference write current value. In various embodiments, the modified write current value is provided by compensation system 70 via control 30 to reference write current register 72 each time compensation system 70 provides the modified write current value. In various embodiments, the modified write current value is provided by compensation system 70 via control 30 to reference write current register 72 at predetermined intervals.

Figure 8:
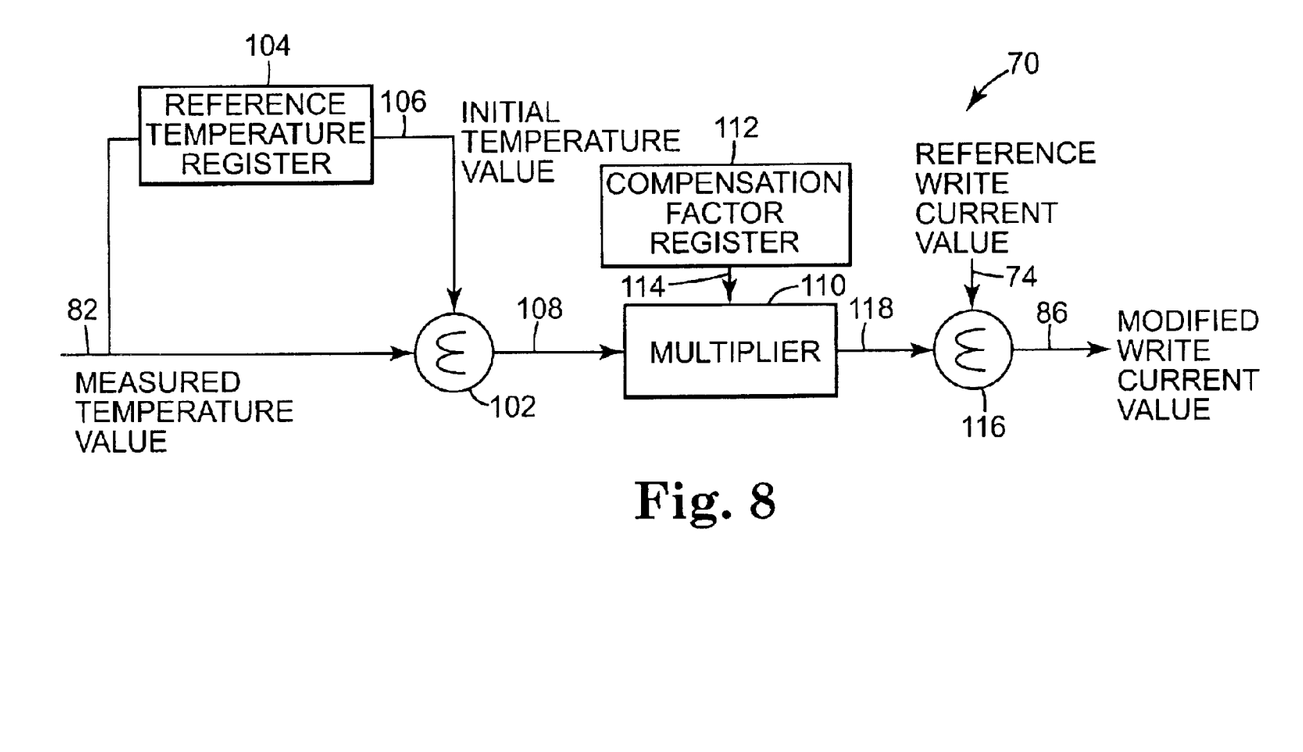
FIG. 8 is a diagram illustrating one exemplary embodiment of a compensation system which provides a modified write current.

FIG. 8 is a diagram illustrating one exemplary embodiment of a compensation system which provides a modified write current value at line 86. In the exemplary embodiment, compensation system 70 includes logic which calculates a change of a reference write current to a modified write current which is proportional to a change in coercivity of the memory cell between a reference temperature and a measured temperature. In the exemplary embodiment, compensation system 70 has a first input on line 74 which is the digital value representing the reference write current. Compensation system 70 has a second input on line 82 which is the digital value representing the measured temperature.

In various embodiments, there are many other suitable approaches within the scope of the present invention of implementing compensation system 70 which provides the modified write current value. In various embodiments, suitable mathematical equations are implemented in logic to calculate the change of the reference write current to the modified write current so that the modified write current value is optimized to ensure that adequate half-select margins exist at a particular temperature (see also, FIG. 6). In one embodiment, the mathematical equations are polynomial equations. In one embodiment, the mathematical equations are piece-wise linear equations. In one embodiment, the mathematical equations are implemented in a register which functions as a look-up table and which stores at least one modified write current value and corresponding measured temperature value.

In the exemplary embodiment, the critical switching field as a function of temperature is modeled as a linear relationship wherein the modified write currents are determined by first order polynomial equations. The magnitude of the critical switching field required to switch magnetic memory cell 14 from the anti-parallel to the parallel orientation or from the parallel to the anti-parallel orientation decreases with increasing temperature (see also, FIG. 5). In the illustrated embodiment, compensation system 70 modifies the reference write current value provided at input 74 as a function of the measure temperature value provided at input 82 so that the critical switching field is maintained over a varying temperature range. In various embodiments, the critical switching field as a function of temperature is derived from approximating a measured or simulated result of the change in coercivity or critical switching field versus temperature relationship for magnetic memory cells 14. In various embodiments, the reference temperature, the reference write current and the measured temperature are known and only the change or slope of the critical switching field versus temperature needs to be applied to determine the modified write current.

In the exemplary embodiment, to implement the first order polynomial equations, the critical switching field is assumed to be proportional to the word line write current $I_x$ and the bit line write current $I_y$. The modified write current ($I_M$) is calculated from the measured temperature ($T_M$) at which $I_M$ is determined, the reference write current ($I_R$), and the reference write current temperature ($T_R$). The modified write current $I_M$ varies according to equation (1):

$$I_M = A + BT_M \tag{1}$$

where:

A is a constant; and

B is a compensation factor value corresponding to the measured slope of the coercivity or critical switching field versus temperature relationship illustrated in FIG. 5.

The reference write current can also be expressed in the same format as equation (1) as illustrated by equation (2)

$$I_R = A + BT_R \tag{2}$$

where:

A and B are the same as in equation (1).

By subtracting equation (2) from equation (1), $I_M$ can be determined by equation (3):

$$I_M = I_R + B(T_M - T_R) \tag{3}$$

In the illustrated embodiment, equation (3) is implemented in logic circuitry to provide the value of the modified write current $I_M$ at line 86. In the illustrated embodiment in FIG. 8, first adder 102 has as inputs two temperature values which are provided on line 82. The reference temperature $T_R$ is the temperature corresponding to the reference write current $I_R$. The reference temperature $T_R$ is provided via line 82 as a digital value and is latched in reference temperature register 104. In one embodiment, the digital values of $T_R$ and $T_M$, as well as the digital values of $I_R$, $I_M$ and B, are in a signed two's-complement number format wherein the most significant bit is a sign bit which is "1" for negative numbers and "0" for positive numbers and for the number zero. In the illustrated embodiment, reference temperature register 104 inverts the most significant bit or sign bit of the digital value of $T_R$ and provides the inverted value to first adder 102 via line 106.

First adder 102 provides the difference temperature value $T_M-T_R$ via line 108 to multiplier 110 in the two's-complement number format. Multiplier 110 multiplies the value of $T_M-T_R$ and the compensation factor value B. The two's-complement value of B is stored within compensation factor register 112 and is provided to multiplier 110 via line 114. In the illustrated embodiment, the most significant bit of the digital value for B is a sign bit which is "1". This is because B corresponds to the slope of the coercivity versus temperature relationship illustrated in FIG. 5 which is negative.

Second adder 116 sums the output of multiplier 110 which is a correction value received via line 118 with the two's-complement digital value of the reference write current $I_R$ provided via line 74 from reference write current register 72. The output of second adder 116 is the two's-complement digital value of the modified write current and is provided to D/A 84 via line 86.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory comprising:
    a magnetic memory cell;
    a conductor which crosses the magnetic memory cell; and
    a circuit coupled to the conductor configured to apply a modified magnetic field to the magnetic memory cell in response to temperature variations in the magnetic memory cell, the circuit including
        a compensation system configured to determine a change of a reference write current to a modified write current, wherein the modified write current is supplied to the conductor to create the modified magnetic field.

2. The magnetic memory of claim 1, wherein the compensation system further comprises:
    a reference write current value;
    a reference temperature value;
    a compensation factor value;
    a temperature sensing system which provides a measured temperature value;
    a compensation system which determines a modified write current value based on the reference write current value, the reference temperature value, the compensation factor value and the measured temperature value; and
    a digital to analog converter configured to convert the modified write current value into the modified write current.

3. The magnetic memory of claim 2, wherein the compensation system comprises:
    a reference temperature register configured to store the reference temperature value;
    a first adder configured to subtract the reference temperature value from the measured temperature value and provide a difference temperature value;
    a compensation factor register configured to store the compensation factor value corresponding to a change in a coercivity of the magnetic memory cell as a function of a temperature;
    a multiplier configured to multiply the difference temperature value and the compensation factor value and provide a correction value; and
    a second adder configured to add the correction value to the reference write current value and provide the modified write current value.

4. The magnetic memory of claim 2, wherein the temperature sensing system comprises:
    a temperature sensor configured to provide an output voltage in response to the measured temperature; and
    an analog to digital converter configured to convert the output voltage into the measured temperature value.

5. A magnetic memory comprising:
    a magnetic memory cell;
    a conductor which crosses the magnetic memory cell; and
    a variable write current source coupled to the conductor configured to provide a modified write current in response to temperature variations in the magnetic memory cell, the variable write current source including
        a compensation system configured to determine a change of a reference write current to a modified write current, wherein the modified write current is supplied to the conductor.

6. The magnetic memory of claim 5, wherein the compensation system further comprises:
    a reference write current value;
    a reference temperature value;
    a compensation factor value;
    a temperature sensing system which provides a measured temperature value;
    a compensation system which determines a modified write current value based on the reference write current value, the reference temperature value, the compensation factor value and the measured temperature value; and
    a digital to analog converter configured to convert the modified write current value into the modified write current.

7. The magnetic memory of claim 6, wherein the compensation system comprises:
    a reference temperature register configured to store the reference temperature value;
    a first adder configured to subtract the reference temperature value from the measured temperature value and provide a difference temperature value;
    a compensation factor register configured to store the compensation factor value corresponding to a change in a coercivity of the magnetic memory cell as a function of a temperature;

a multiplier configured to multiply the difference temperature value and the compensation factor value and provide a correction value; and a second adder configured to add the correction value to the reference write current value and provide the modified write current value.

8. The magnetic memory of claim 6, wherein the temperature sensing system comprises:

a temperature sensor configured to provide an output voltage in response to the measured temperature; and an analog to digital converter configured to convert the output voltage into the measured temperature value.

9. A magnetic memory comprising:

one or more magnetic memory cells;

one or more first conductors and second conductors which cross the magnetic memory cells, wherein each magnetic memory cell is intersected by a first conductor and a second conductor; and a variable write current source configured to provide a modified write current to a selected one of the one or more first conductors in response to temperature variations in the one or more magnetic memory cells, the variable write current source including a compensation system configured to determine a change of a reference write current to a modified write current.

10. The magnetic memory of claim 9, wherein the compensation system further comprises:

a reference write current value;

a reference temperature value;

a compensation factor value;

a temperature sensing system which provides a measured temperature value;

a compensation system which determines a modified write current value based on the reference write current value, the reference temperature value, the compensation factor value and the measured temperature value; and a digital to analog converter configured to convert the modified write current value into the modified write current.

11. The magnetic memory of claim 10, wherein the compensation system comprises:

a reference temperature register configured to store the reference temperature value;

a first adder configured to subtract the reference temperature value from the measured temperature value and provide a difference temperature value;

a compensation factor register configured to store the compensation factor value corresponding to a change in a coercivity of the magnetic memory cell as a function of a temperature;

a multiplier configured to multiply the difference temperature value and the compensation factor value and provide a correction value; and a second adder configured to add the correction value to the reference write current value and provide the modified write current value.

12. The magnetic memory of claim 10, wherein the temperature sensing system comprises:

a temperature sensor which provides an output voltage in response to the measured temperature; and an analog to digital converter for converting the output voltage into the measured temperature value.

13. A magnetic memory comprising:

a magnetic memory cell;

a conductor which crosses the memory cell; and means to apply a modified magnetic field to the magnetic memory cell in response to temperature variations in the magnetic memory cell, the means including determining a change of a reference write current to a modified write current and supplying the modified write current to the conductor to create the modified magnetic field.

14. The magnetic memory of claim 13, wherein the means further includes:

a reference write current value;

a reference temperature value;

a compensation factor value;

a temperature sensing system which provides a measured temperature value;

a compensation system which determines a modified write current value based on the reference write current value, the reference temperature value, the compensation factor value and the measured temperature value; and a digital to analog converter configured to convert the modified write current value into the modified write current.

15. A method of applying a variable magnetic field, the method comprising:

providing a magnetic memory cell;

providing a conductor which crosses the magnetic memory cell;

applying a modified magnetic field to the magnetic memory cell in response to temperature variations in the magnetic memory cell;

determining a change of a reference write current to a modified write current; and supplying the modified write current to the conductor to create the modified magnetic field.

16. The method of claim 15, further comprising providing a reference write current value;

providing a reference temperature value;

providing a compensation factor value;

measuring a temperature;

converting the measured temperature into a measured temperature value;

determining a modified write current value based on the reference write current value, the reference temperature value, the compensation factor value and the measured temperature value; and converting the modified write current value into the modified write current.

17. The method of claim 16, wherein the determining of the modified write current value further comprises:

subtracting the reference temperature value from the measured temperature value and providing a difference temperature value;

multiplying the difference temperature value and the compensation factor value and providing a correction value; and adding the correction value to the reference write current value and providing the modified write current value.

* * * * *